United States Patent [19]

Ishijima et al.

[11] 4,382,198
[45] May 3, 1983

[54] AMPLITUDE LIMITER CIRCUIT

[75] Inventors: Yasumori Ishijima, Kodaira; Rikichi Murooka, Kamagaya, both of Japan

[73] Assignee: Tektronix, Inc., Beaverton, Oreg.

[21] Appl. No.: 218,605

[22] Filed: Dec. 22, 1980

[30] Foreign Application Priority Data

Jan. 9, 1980 [JP] Japan ............................... 55-513

[51] Int. Cl.³ .............................................. H03K 5/08
[52] U.S. Cl. .................................. 307/555; 307/360; 307/560; 328/173
[58] Field of Search ............... 307/360, 540, 544, 546, 307/547, 549, 555, 560, 561, 564; 328/169, 171, 173, 172

[56] References Cited

U.S. PATENT DOCUMENTS 3,659,117  4/1972  Caveney et al. ................. 307/564
3,947,776  3/1976  Stevens et al. .................. 307/360

Primary Examiner—John Zazworsky
Attorney, Agent, or Firm—George T. Noe

[57] ABSTRACT

An amplitude limiter circuit is provided in which the output terminal is disconnected from the input terminal, or the input signal source, when the input signal amplitude exceeds the predetermined upper and/or lower limit. Voltage maintenance means maintains the output voltage when the amplitude limiting condition is reached.

10 Claims, 6 Drawing Figures

AMPLITUDE LIMITER CIRCUIT

BACKGROUND OF THE INVENTION

This invention relates to an amplitude limiter circuit for limiting the amplitude of an output signal.

An amplitude limiting circuit is used to limit the amplitude of an output signal within a predetermined range and is referred to as a limiter circuit or a slice circuit, depending on its applications. A circuit schematic of a typical conventional amplitude limiter circuit is shown in FIG. 1. Desired or limiting voltages, e.g. $+V_1$ and $-V_2$ are applied to one terminal of each diodes 10 and 12. When the input voltage Vi (for example a triangle waveform in FIG. 2A) applied from a signal source (not shown) through input terminal 2 is within the amplitude limiting range, i.e., $-V_2 < V_i < +V_1$, both diodes 10 and 12 are OFF to allow the input signal to pass to output terminal 6 through resistor 14. However, diode 10 alone is ON to clamp the output voltage to the predetermined upper voltage $V_1$ for $+V_1 < V_i$, and diode 12 along is ON to clamp the output voltage to the $-V_2$ for $V_i < -V_2$ (see FIG. 2B).

Now, turning on either diode 10 or 12 causes a current ($I_R$ in FIG. 2C) to flow into the signal source through resistor 14, thereby causing undesirable effects such as distortion upon the signal waveform. Letting stray capacitance of diodes 10 and 12 and resistance of resistor 14 be respectively Cd and R, the time constant TC of the circuit in FIG. 1 is given by the following expression:

$$TC = 2R\ Cd.$$

Considering load capacitance $C_L$ between the output terminal 6 and ground, $$TC = R\ (2Cd + C_L).$$

This suggests that the use of larger resistance R to reduce the current $I_R$ and, in turn, the loading effect to the signal source, the time constant increases to degrade the frequency response. On the contrary, an attempt to improve the frequency response by using smaller resistance R will result in increasing the loading effect to the signal source.

It is therefore an object of this invention to provide an amplitude limiter circuit with minimum loading effect to the signal source connected to the input terminal and excellent frequency response.

Other objects and advantages will become apparent to those skilled in the art upon a reading of the following description when taken in conjunction with the drawings.

DETAILED DESCRIPTION OF THE INVENTION

The present invention will be described in detail hereinafter by reference to the accompanying FIGS. 3 and 5.

Figure 3:
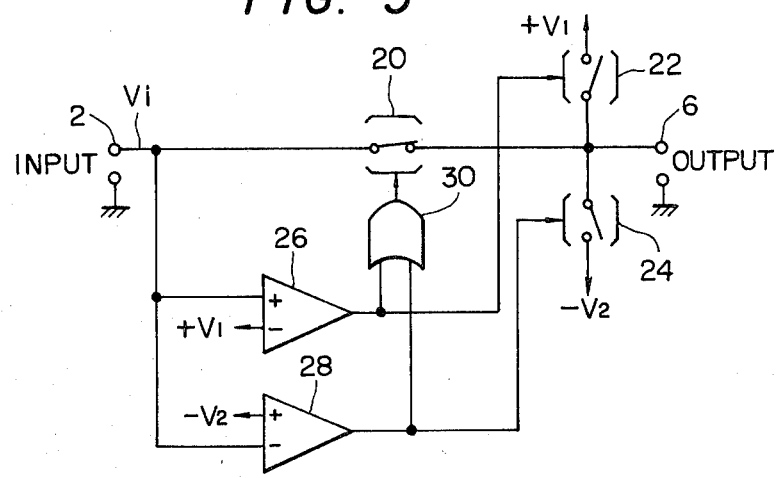
FIGS. 3, 4 and 5 are respectively first, second and third embodiments of this invention.

FIG. 3 is a simplified circuit schematic of a first embodiment of this invention. Switch means 22 and 24 are voltage maintenance means with one terminal of each of the switch means applied to arbitrarily predetermined voltages $+V_1$ and $-V_2$. The input signal voltage $V_i$ from the signal source (not shown) is applied through input terminal 2 to switch means 20, the non-inverting input terminal of comparator 26 and the inverting input terminal of comparator 28. The other input terminals of comparators 26 and 28 are respectively connected to the predetermined voltages $+V_1$ and $-V_2$ as shown in FIG. 3. It should be noted that the input impedance of comparators 26 and 28 is high enough to have a negligible effect upon the signal source.

Assuming that the input signal voltage $V_i$ is larger than $-V_2$ but lower than $+V_1$ ($-V_2 < V_i < +V_1$), the both outputs from comparators 26 and 28 are "0". Switch means 20 remains in the closed state. Switch means 22 and 24 each controlled by comparators 26 and 28 are in the open state while the respective comparator is in the "0" state, but are closed while the respective comparator is in the "1" state.

When $V_i > +V_1$, the output of comparator 26 becomes "1" to turn OFF and ON switch means 20 and 22 respectively with switch means 24 remaining OFF. Output terminal 6 is disconnected from input terminal 2. However, the voltage on output terminal 6 is clamped to $+V_1$ by switch means 22. In case of $V_i < -V_2$, the output of comparator 28 is "1" to turn OFF and ON switch means 20 and 24 respectively while switch means 22 remains OFF. Agains, output terminal 6 is disconnected from input terminal 2 but is maintained at $-V_2$ by switch means 24. Comparators 26 and 28 and OR circuit 30 constitute control means.

Figure 1:
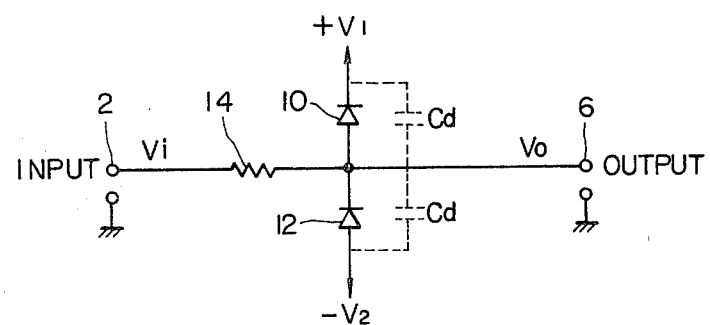
FIG. 1 is a circuit schematic of a conventional amplitude limiter circuit.
Figure 2:
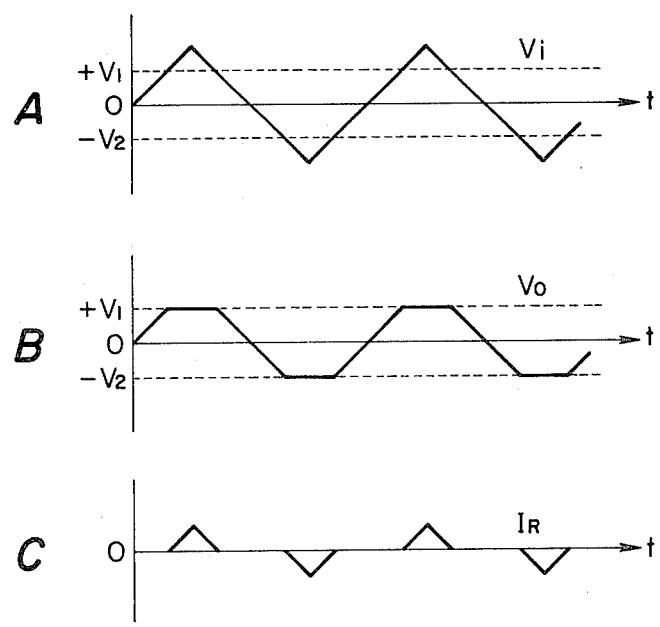
FIG. 2 shows voltage and current waveforms for explaining the circuit operation of FIG. 1.

As is understood from the foregoing description, the output terminal is effectively disconnected from the input terminal (and the signal source) for amplitude limiting purpose while applying a desired voltage to the output terminal, thereby removing undesirable effects upon the signal source unlike the conventional circuit. Also, a small time constant TC of the circuit realizes a wideband amplitude limiter circuit by using high speed switch means such as diode bridges or the like for switch means 20, 22 and 24. Although both of the upper and lower amplitudes of the output signal are limited in FIG. 1, it is a matter of course that only one of the may be limited depending on particular applications. This is also true about the embodiment shown in FIGS. 4 and 5.

Figure 4:
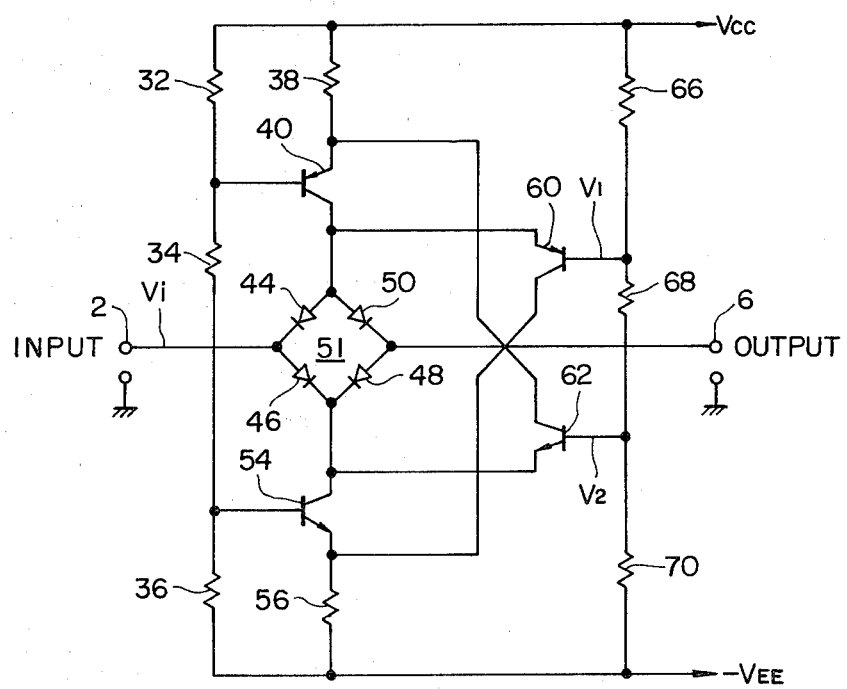

Shown in FIG. 4 is a circuit schematic of a second embodiment of this invention. Predetermined voltages $+V_1$ and $-V_2$ are applied to the bases of transistors 60 and 62 and are determined by voltage sources $V_{cc}$ and $-V_{ee}$ and resistance of resistors 66, 68 and 70. It is to be noted here that the voltage drop across diodes 48 and 50 are respectively compensated by the base-emitter voltage of transistors 60 and 62. Transistors 40 and 54, dividing resistors 32 through 36 and resistors 38 and 56 constitute a pair of current sources. If the input signal voltage $V_i$ is within the upper and lower amplitudes, i.e., $-V_2 < V_i < +V_i$, the current from current source transistor 40 flows through diode bridge high speed switch means 51 made of diodes 44 through 50, another current source transistor 54 and resistor 56. Therefore, switch means 51 is ON and transistors 60 and 62 are both reverse biased or OFF. Since input terminal 2 is connected through switch means 51 to output terminal 6, the input signal voltage $V_i$ appears directly at output terminal 6. The currents flowing through resistors 38 and 56 are chosen to be equal to each other.

When the input signal voltage $V_i$ exceeds the predetermined voltage $+V_1$ in FIG. 4, transistor 60 turns on to reverse bias diode 44. The emitter current of transistor 40 is split into the series circuit of transistor 60 and resistor 56. This current split causes a slight potential increase on the junction of resistor 56 and the emitter of transistor 54 to finally turn transistor 54 OFF. Diodes 46 and 48 also become OFF to disconnect output terminal 6 from input terminal 2 and to simultaneously apply the predetermined voltage $+V_i$ to output terminal 6 through diode 50.

The circuit operates similarly in case of $V_i < -V_2$. However, diode 46 is OFF and transistor 62 is ON in this case. Turning ON transistor 62 renders transistor 40 and diodes 44 and 50 OFF. That is, input and output terminals are disconnected and the predetermined voltage $-V_2$ appears at output terminal 6 through diode 48. In this embodiment, current source transistors 40 and 54, diodes 44 and 46, transistors 60 and 62, and associated circuit elements constitute control means. Diodes 48 and 50 constitute voltage maintenance means.

Figure 5:
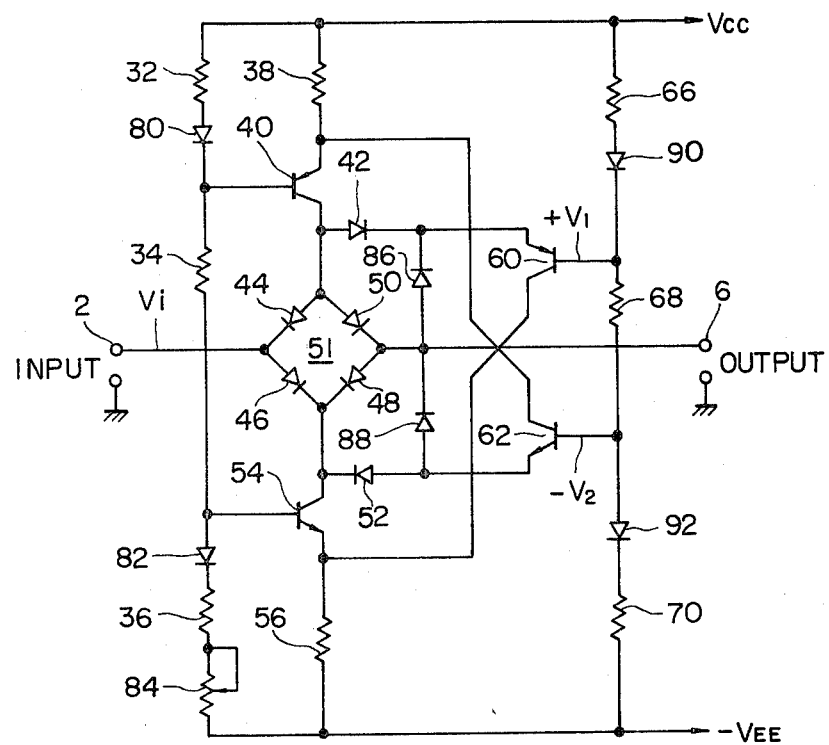
Figure 6:
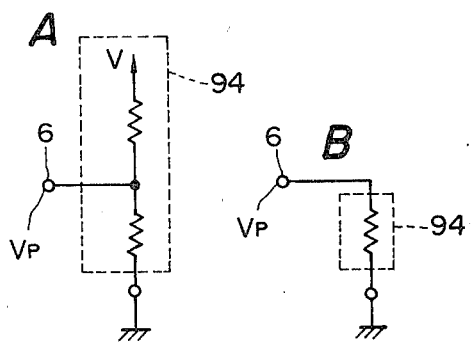
FIG. 6 is a circuit schematic for explaining the operation of the circuit in FIG. 5.

FIG. 5 is a circuit schematic illustrating a third embodiment of this invention. In FIG. 5, similar reference numerals to those of FIG. 4 are used to represent like elements. The circuits in FIGS. 4 and 5 are identical to each other except the addition of temperature compensation diodes 80, 82, 90 and 92, variable resistor 84, and diodes 42, 52, 86, and 88. Variable resistor 84 is used to equalize the currents through transistors 40 and 54. Temperature compensation diodes 80, 82, 90 and 92 compensate for drift due to the respective base-emitter junction voltages of transistors, 40, 54, 60 and 62 under different temperatures. In the case in which a load including a voltage source as shown in FIG. 6A is connected to output terminal 6, there is an attempt to develop a potential $V_p$ on terminal 6 when switch means 51 turns OFF. Diodes 48 and 50 are OFF as long as $-V_2 < V_p < +V_1$, but diodes 86 and 88 now constituting voltage maintenance means to maintain the terminal voltage ($V_p$) at either $+V_1$ or $-V_2$. Diodes 42 and 52 are interposed to ensure non-conduction (OFF) of switch means 51. It is understood that diodes 42, 52, 86, and 88 can be eliminated if the load is as shown in FIG. 6B. The other circuits operate in the same manner as the second embodiment shown in FIG. 4, thus further description will be omitted.

As described earlier, the amplitude limiter circuit according to this invention disconnects the output terminal from the input terminal and applies the predetermined voltage equal to the limiting voltage to the output terminal when the input signal voltage reaches the amplitude limiting voltage. Therefore, any undesirable effects upon the signal source in the conventional amplitude limiting operation are effectively eliminated. In addition, the present invention is operable over wide frequency range because the circuit exhibits a very short circuit time constant and allows the use of a very high switching element such as a diode bridge or the like.

What we claim as being novel is:

1. An amplitude limiter circuit, comprising:
   an input terminal for receiving an input voltage signal and an output terminal;
   switch means connected between said input and output terminals;
   control means for maintaining said switch means conducting when said input signal remains within a predetermined limit and non-conducting when said signal exceeds said predetermined limit; and
   voltage maintenance means responsive to said control means for maintaining the voltage on said output terminal at said predetermined limit when said switch means is non-conducting.

2. An amplitude limiter circuit according to claim 1, wherein said control means includes a comparator for comparing said input voltage signal with said predetermined limit.

3. An amplitude limiter circuit according to claim 1, or 2, wherein said voltage maintenance means includes a switch for applying a voltage equal to said predetermined limit to the output terminal.

4. An amplitude limiter circuit according to claim 1, wherein said switch means and said switch of said voltage maintenance means are made by a diode bridge circuit.

5. An amplitude limiter circuit according to claim 1, wherein said control means detects whether the input voltage is within or outside a range defined by two predetermined levels for controlling said switch means and said voltage maintenance means in accordance with the detected output.

6. An amplitude limiter circuit according to claim 5, wherein said voltage maintenance means includes two switches for applying either one of said predetermined levels to the output terminal.

7. An amplitude limiter circuit, comprising:
   an input terminal and an output terminal;
   a diode bridge circuit connected between said input and output terminals, said diode bridge circuit having two control terminals;
   a pair of current source means each connected respectively to one of said two control terminals; and
   first and second transistors, each having an emitter connected to a respective one of said control terminals and a collector connected to the current source means which is connected to the other of said control terminals, the bases of said first and second transistors coupled respectively to first and second predetermined voltages.

8. An amplitude limiter circuit according to claim 7 further comprising first and second diodes connected respectively between the emitter of each of said first and second transistors and the output terminal.

9. An amplitude limiter circuit according to claim 8 further comprising third and fourth diodes connected respectively in series with the emitter of said first and second transistors.

10. An amplitude limiter circuit according to claim 7 wherein said current source means provide a current equal to each other.

* * * * *

UNITED STATES PATENT AND TRADEMARK OFFICE
CERTIFICATE OF CORRECTION

PATENT NO. : 4,382,198
DATED : May 3, 1983
INVENTOR(S) : Ishijima et al.

It is certified that error appears in the above—identified patent and that said Letters Patent is hereby corrected as shown below:

On the title page

Assignee: Tektronix, Inc. Beaverton, Oregon, should be:

Assignee: Sony/Tektronix Corporation, Tokyo, Japan.

Signed and Sealed this

Second Day of August 1983

[SEAL]

Attest:

GERALD J. MOSSINGHOFF

Attesting Officer

Commissioner of Patents and Trademarks